United States Patent [19]

Matthews et al.

[11] 4,350,960
[45] Sep. 21, 1982

[54] SELF SATURATING SEMICONDUCTOR LASERS

[75] Inventors: Michael R. Matthews; David H. Newman; David R. Smith; Alan G. Steventon, all of Woodbridge, England

[73] Assignee: The Post Office, London, England

[21] Appl. No.: 168,107

[22] Filed: Jul. 14, 1980

Related U.S. Application Data

[63] Continuation of Ser. No. 918,563, Jun. 23, 1978, abandoned.

[30] Foreign Application Priority Data

Jul. 1, 1977 [GB] United Kingdom ............... 27666/77

[51] Int. Cl.³ .............................................. H01S 3/19
[52] U.S. Cl. ......................................... 372/46; 357/17
[58] Field of Search .................... 331/94.5 H; 357/17, 357/18

[56] References Cited

PUBLICATIONS

Paoli, "Saturation Behavior of the Spontaneous Emission From Double-Heterostructure Junction Lasers Operating High Above Threshold", *IEEE Journal of Quantum Electronics,* vol. QE 9, No. 2, Feb. 1973, pp. 267-272.

Crow, "Integral Source/Receiver Package for Optical Data", *IBM Technical Disclosure Bulletin,* vol. 20, No. 5, Oct. 1977, pp. 2089-2090.

Hutchins, "Adjusting the Height of Heat Sink Heterojunction Lasers to Meet up With Optical Couplers and Waveguides", *IBM Technical Disclosure Bulletin,* vol. 17, No. 10, Mar. 1975, p. 3134.

*Primary Examiner*—James W. Davie
*Attorney, Agent, or Firm*—Kemon & Estabrook

[57] ABSTRACT

A double heterostructure semiconductor laser having the configuration of its optical cavity arranged to impose a constraint on the lasing filament as the spatial distribution of the lasing filament changes from that occuring at the start of the lasing regime, so that the optical flux emitted by the laser has self-saturating properties. This protects the laser from catastrophic facet erosion and enables a simpler control circuit to be used to drive this laser when it is used as a light source for an optical communications system.

11 Claims, 10 Drawing Figures

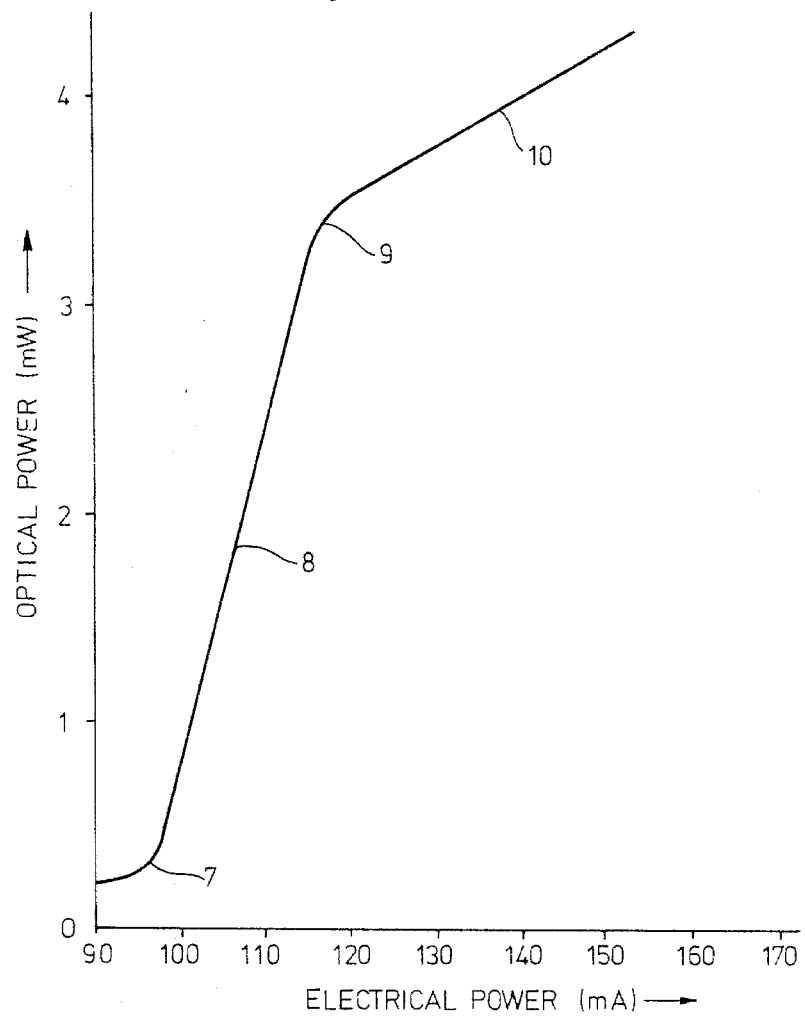

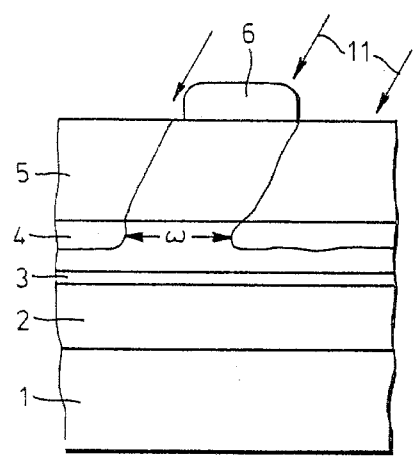
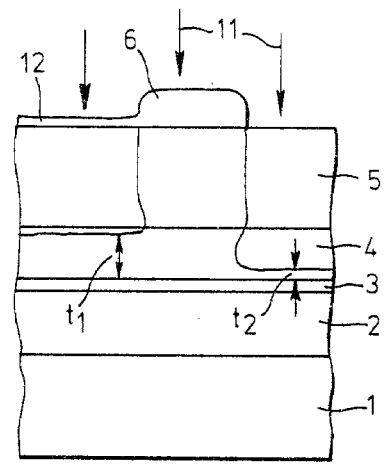
Fig. 3a        Fig. 3b
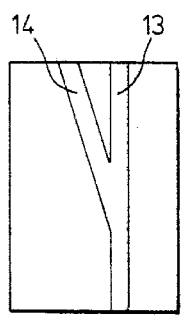
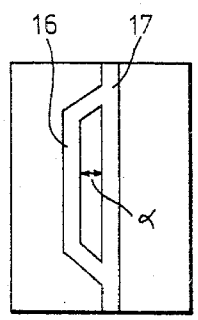
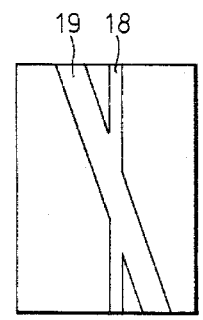
Fig. 4a    Fig. 4b    Fig. 4c

SELF SATURATING SEMICONDUCTOR LASERS

This is a continuation, of application Ser. No. 918,563, filed June 23, 1978, now abandoned.

This invention relates to semiconductor lasers of the double-heterostructure type. Such lasers are particularly effective as a light source for use in digital optical communication systems, in which light pulses representing information are transmitted through optical fibre wave-guides.

The DC light output characteristics of a typical double-heterostructure semiconductor laser show that it has a low incremental efficiency on its non-lasing regime when the light is emitted by mere spontaneous emission. However, once the device reaches the threshold condition at which it begins to lase the incremental efficiency increases very sharply to give a straight line relationship between the optical flux emitted and the electrical current applied to it. In a typical device having narrow stripe geometry the optical flux emitted is in excess of 10 mW when the electrical current applied to it is increased by between 20 and 50 mA above threshold value. The threshold current at which the device begins to lase is dependent upon temperature.

One of the ways in which a laser fails is by the erosion or burn-off of its facets or output faces by the optical flux emitted by the device. For a laser with uncoated facets an output optical power density of between 2 and $4 \times 10^5$ watts per square centimeter, generated continuously, causes erosion of the facets and, for a laser having stripe-geometry of width of between 10–20 $\mu m$, this can occur at a power level of as low as 10 mW. The laser eventually fails by slow facet erosion if it is held at these output power levels or, it may fail catastrophically if the electrical power applied to it is increased to give an optical flux output in excess of these power levels. Facet burn-off can occur as a result of uncompensated changes of the laser threshold arising from the changes of the laser temperature, and as a result of transient changes occuring in the electrical power supply to the laser.

At present, sophisticated and complex control circuits are required which take account of the temperature at which the laser is operating and any degradation of the laser and maintain the optical flux emitted by the laser at a predetermined level, for example 3 mW. Such control circuits rely on feedback from the light output. The sophistication of the control circuit has to increase as the incremental efficiency of the laser is increased. It is difficult to arrange for the control circuit to respond quickly enough to compensate for transient changes in the electrical power supply. The control circuit must also be able to accommodate the supply of the driving pulses which may be fed to the laser to drive it to give a pulsed output. In view of this it is difficult to suppress completely transients that allow the optical flux to build up to an extent where damage is caused to the laser.

According to this invention, the configuration of the optical cavity of a double-heterostructure semiconductor laser is arranged to impose a constraint on the lasing filament as the spatial distribution of the lasing filament changes from that occurring at the start of the lasing regime, so that the optical flux emitted by the laser has self-saturating properties.

For the output of the laser to have self-saturating properties the incremental efficiency of the laser, over the higher parts of its range, must decrease. Preferably there is still a straight line relationship between the optical flux emitted and the electrical current applied to the laser in the region immediately above the threshold level at which lasing occurs and preferably the laser still has a high value of incremental efficiency in this region, but then the incremental efficiency reduces to a lower level as the electrical power applied to the laser is increased further. Such a laser is much more flexible since it has a similar incremental efficiency to existing devices when the power applied to the laser is in the region immediately above the threshold value, but the incremental efficiency reduces as the electrical power level is increased. Preferably the total incremental efficiency of the laser in the region immediately above the threshold is at least 12% and it may be as high as 80% or 90%.

In operational use there are several advantages in using a laser in accordance with this invention as a light source for an optical communications system. In such systems the lasers are pulsed to give an output which changes from a non-lasing output to an output which is in the lasing regime and which has sufficient intensity to overcome losses due to absorption encountered in the optical wave guide. Using a laser in accordance with this invention the driving pulses for driving the laser can be arranged to drive the laser from its non-lasing regime into its saturation region. In the saturation region the output optical power of the laser is relatively insensitive to variations in the driving current and the threshold current, and hence the temperature at which the laser is operating. Thus, over a specific operating life and temperature range the optical output power of the laser may be stabilized by a simple control circuit without the use of a complex feedback control system since saturation effects of the laser prevent the rate of facet erosion exceeding some predetermined maximum value determined by the particular application of the laser under consideration.

The point at which the incremental efficiency of the laser changes and which corresponds to the start of the saturation region is determined by taking into account the susceptibility of the laser to damage. Thus, it is dependent upon the cross-sectional area of active region, and hence the optical power density, and whether facet coatings have been used to increase its erosion resistance. There is no specific value of the optical power density above which slow facet erosion occurs, the rate of erosion merely being dependent on the optical power. The point at which saturation is required to occur is also arranged to take account of the acceptable degradation rate of the laser in any particular application under consideration. Typically, the point at which the saturation region begins corresponds to a value of emitted optical flux of a few milliwatts and for a stripe geometry laser having a 10 $\mu m$ stripe width and uncoated facets, this is preferably arranged to be about 3 mW. After this point the incremental efficiency of the device preferably reduces to a value which is no greater than 50% of the substantially constant value, and ideally zero. It is further preferred that the point at which the saturation region commences is between 25% and 75% of the optical flux which causes catastrophic erosion of the laser facets.

In a double-heterostructure semiconductor laser the spatial distribution of the lasing filament in the transverse direction across the width of the optical cavity has a Gaussian distribution with the axis of the maximum intensity along the centre of the optical cavity. The optical flux within the optical cavity increases as the electrical power applied to the laser is increased and, as the applied power increases the spatial distribution of the lasing filament changes from that occurring at the start of the lasing regime.

At threshold, the transverse carrier profile across the optical cavity is peaked at its centre. The spatial transverse gain profile can be expressed as:

$$g(x) = An(x) - B \text{ for } g(x) > C$$

and otherwise $= C$
where g is the spatial gain, and A and B are constants, C is the background absorption of the material and n(x) is the transverse carrier concentration profile. Thus, at threshold the gain is peaked at the centre of the stripe. For narrow cavity widths where the width w < 10-15 μm, the gain is sharply peaked and is generally sufficient to hold the lasing filament central in the optical cavity even in the presence of small inhomogeneities in the cavity.

Above threshold, and when strong lasing occurs, the stimulated emission process depletes the concentration of carriers at the centre of the stripe and these are replenished by lateral or transverse current flow in the passive layers above the active layer and by lateral or transverse diffusion within the active region. The extent to which carrier replenishment occurs depends on the optical flux density, the resistivity of the layers bounding the active layer and the effective active region lateral diffusion length. Under situations of high bounding layer resistivity and short effective active region diffusion length, a flattening of the maximum of the carrier, and hence, of the gain profile occurs, so that the lasing filament is less well guided by the gain profile and tends to spread out in extent transversely. In this condition, since the lasing filament is less strongly guided it is more easily perturbed by inhomogeneities present in the device structure. We have noticed that the spatial distribution of the lasing filament may also change by transverse movement of its axis as the power applied is increased. This change in the spatial distribution is used to advantage in this invention to establish a self-saturating property for a laser.

The configuration of the optical cavity of the laser may be substantially uniform with the effective width of the optical cavity being arranged such that as the electrical power applied increases, and the spatial distribution of the lasing filament changes, the lasing filament approaches the edges of the optical cavity and moves into more lossy regions, and hence encounters a higher overall loss. Thus there is a decrease in the overall efficiency of the laser.

Alternatively, the configuration of the optical cavity may be non-uniform in nature, created by the introduction of controlled non-uniformities into its structure which affect the optical cavity of the laser. In this case, the laser is arranged so that as the electrical power applied increases and the spatial distribution of the lasing filament changes, a greater proportion of the lasing filament propagates in a lossy region of the optical cavity which is affected by the introduced non-uniformities. Thus there is a decrease in the overall efficiency of the laser and the optical flux tends towards a saturation value.

The configuration of the optical cavity may be modified by modifying the configuration or properties of the active layer, or, alternatively, the configuration may be modified by governing the configuration or properties of the other layers of the laser and thereby affecting the optical cavity or the electrical pumping arrangements of the laser and hence the configuration of the optical cavity. In double-heterostructure semiconductor lasers the thickness of the active layer is typically about 0.2 μm. Consequently some propagation of the lasing filament takes place in the passive layers on each side of the active layer and these portions of the passive layers form part of the optical cavity of the laser. Thus by modifying these layers, particularly by modifying the real or apparent refractive index of these layers, the optical cavity of the laser may be modified. Preferably the configuration of the optical cavity is controlled by selecting the shape and arrangement of the electrodes, and the electrical pumping path of the laser by which electrical power is applied to the active region. Changing the effective shape or arrangement of the electrodes, and the electrical pumping path of the laser affects not only the distribution of charge carriers and hence the pumping arrangements but it may also affect the optical properties of the optical cavity, for example its refractive index.

This may occur as a result of the electrical potential applied, in use, or it may occur as a result of physical changes to the laser, for example their doping levels or non-uniformities introduced into the crystal lattice structure.

Usually a double-heterostructure laser has stripe-geometry and, one way of achieving this is to have electrodes arranged in stripes extending along the length of the optical cavity and perpendicular to the facets of the laser. The lateral or transverse current spreading plays a significant part in determining the effective width of the optical cavity of the laser. Even if a stripe electrode had a width of only 1 μm then the effective width of the optical cavity would still be several μm. However, using techniques of proton or ion bombardment which causes damage to the lattice structure of the semiconductor and increase its electrical resistance, it is possible to reduce the effective width of the optical cavity. The proton or ion bombardment reduces the effective lateral carrier diffusion length and we have found that the deeper the bombardment into the laser, for a particular stripe width, the greater the self-saturating effects. However, for a laser to be useful as a light source for an optical communications system the light output must be at least 2 mW before the self-saturation effect set in, and it is sometimes required to be as high as 5 mW. We have found that the bombardment should not penetrate into the active layer if this output power is to be achieved before self-saturation. We have found that self-saturation effects are dependent upon the stripe width and on the depth of proton or ion bombardment. For the laser to be effective as a light source for an optical communications system its stripe width should be between 5 and 10 μm. For a laser having a stripe width of 5 μm we have found that the bombardment proximity to the active layer is preferably within a range from 0.7 to 0.2 μm; and, for a laser having a stripe width of 10 μm we have found that the bombardment proximity to the active layer is preferably within a range from 0.3 to 0.0 μm.

The configuration of the optical cavity may also be controlled in a non-uniform manner by introducing asymmetric bombardment profiles by inclination of the laser surface to the ion or proton beam during bombardment or by selective masking on the surface of the laser. In this way the bombardment may be deeper on one side of the optical cavity than on the other leading to an asymmetry in the configuration of the optical cavity.

When the optical cavity is non-uniform the non-uniformity is preferably introduced over a part of the cavity length and preferably the non-uniformity has the form of a branched gain region leading away from the remainder of the optical cavity. In this case there are two alternative paths for the lasing filament to follow and one is more lossy than the other. The two paths are preferably arranged so that changes in the charge carrier concentration in one path have no direct influence on the carrier concentration in the other path. When the laser includes a branched optical cavity preferably it is arranged so that when the laser begins to lase the lasing filament is initially present in the less lossy path of the cavity and remains following this path until the point at which the incremental efficiency changes at the start of the saturation region. After this point the depletion of the charge carriers in the less lossy path is such that the number of charge carriers available in the other path provides sufficient gain to overcome the additional losses in the other path and thus further reduces the carrier depletion in the common parts of the two paths. This may lead to a reduction in the light output from the device. The branched optical cavity may be Y-shaped or X-shaped and thus terminate at one or both facets. Alternatively, it is formed as a loop beside a portion of a normal stripe configuration cavity and so appears at neither facet. This latter case may be preferred when the laser is to be used as a light source for an optical communications system since it increases the extinction ratio in such a system.

Rib waveguide, buried heterostructure and channelled substrate stripe lasers which are all types of double heterostructure lasers may also have the configuration of their optical cavities arranged so that they have self-saturating properties.

One of the principal uses of a laser in accordance with this invention is its use as a light source for an optical communication network. Thus, according to another aspect of this invention a double-heterostructure semiconductor laser having the configuration of its optical cavity arranged to impose a constraint on the lasing filament as the spatial distribution of the lasing filament changes from that occuring at the start of the lasing regime, so that, in use, the optical flux emitted by the laser has self-saturating properties, is connected to a coupling lens, so that the laser and lens combination may be connected to an optical fibre waveguide to form a light source for an optical communication network.

According to a further aspect of this invention, a double heterostructure, semiconductor laser having the configuration of its optical cavity arranged to impose a constraint on the lasing filament as the spatial distribution of the lasing filament changes from that occuring at the start of the lasing regime, so that, in use, the optical flux emitted by the laser has self-saturating properties, is butt coupled to an optical fibre waveguide to form a light source for an optical communications network.

In a stripe-geometry double-heterostructure semiconductor laser having a stripe width within a range from 20–30 μm as the electrical power applied to it is increased, the axis of the maximum intensity of the lasing filament moves sideways a distance of between 1 and 2 μm. When such a stripe laser in accordance with this invention is connected to a coupling lens this sideways movement of the lasing filament and the coresponding sideways movement of its output has a negligible effect on the launching efficiency of the laser. Further, when the laser according to this invention has a narrow stripe-geometry and a width of approximately 5 μm the sideways movement of the lasing filament is between 0.5 and 0.75 μm. Equally, this sideways movement of the optical flux has little or no effect on the launching efficiency of the laser when it is butt coupled to the end of an optical waveguide.

Particular examples of lasers in accordance with this invention will now be described with reference to the accompanying drawings in which:

FIG. 2 is a graph showing the optical power output plotted against the electrical power input of the first example;

FIGS. 3a and 3b show two modifications of the first example;

FIGS. 4a, 4b and 4c are diagrams showing the configuration of the optical cavity in three further examples.

Figure 1:
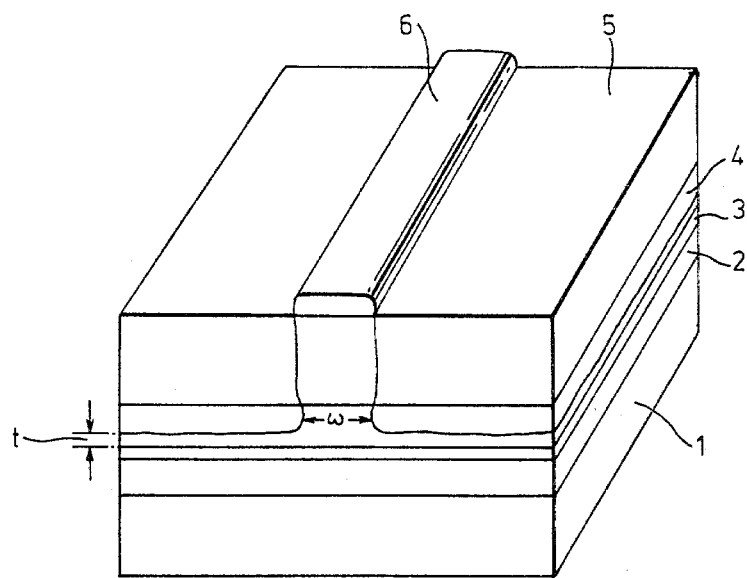
FIG. 1 is an isometric view of a first example.
Figure 5:
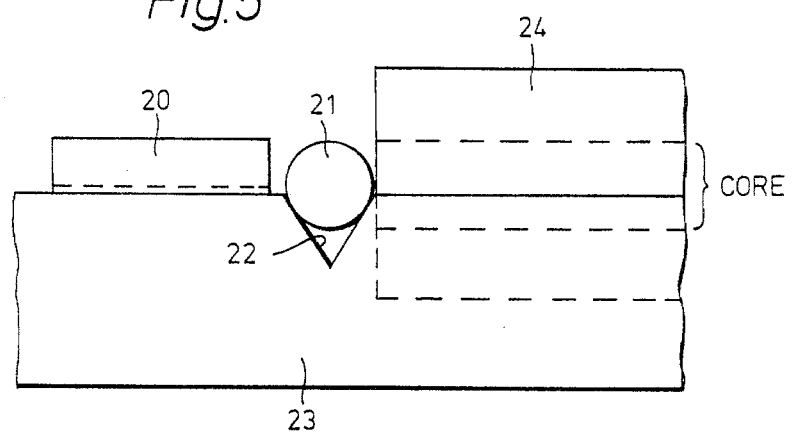
FIGS. 5, 6 and 7 are diagrams illustrating the coupling of laser light sources embodying the invention into optical fibres in optical communications networks.
Figure 6:
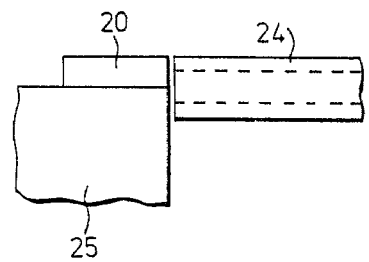
Figure 7:
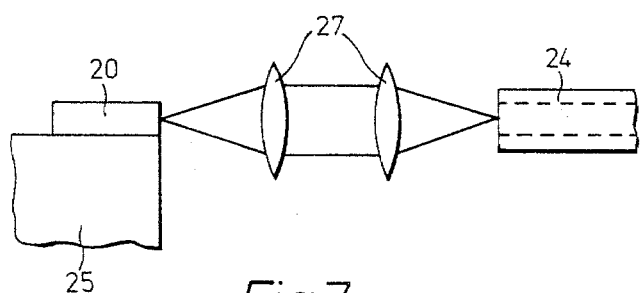

The first example of a laser was fabricated on a conventional double-heterostructure wafer having an n-type gallium arsenide substrate 1 on top of which there is a layer of n-type gallium aluminium arsenide 2, a layer of p-type gallium arsenide 3 which forms the active layer, a layer of p-type gallium aluminium arsenide 4 and finally a layer of p-type gallium arsenide 5. FIG. 1 is purely a schematic diagram since the total thickness of the wafer is about 70 μm whereas the thickness of the active layer 3 is approximately 0.2 μm, the thickness of the layer 2 is about 2 μm and the thickness of each of the layers 4 and 5 is about 1 μm. A gold stripe 6 having a width of about 6 μm was deposited on the wafer using conventional techniques and then the wafer was bombarded by protons. The proton bombardment was carried out with a Van der Graaf accelerator using $H_3^+$ ions that dissociate on the surface of the gallium arsenide into 3 equal energy protons. The wafer was first bombarded with 600 eV $H_3^+$ ions at a surface density of $10^{15}$ per centimeter$^2$ and then with 400 eV energy $H_3^+$ ions again at a surface density of $10^{15}$ per centimeter$^2$. The wafer was oriented with respect to the $H_3^+$ ion source by misaligning the slice by 8° to the axes of the crystal lattice structure. This ensures that the protons do not channel into the lattice structure and consequently ensures that a controlled depth of penetration is achieved.

The protons penetrate into the parts of the layers 4 and 5 which are not protected by the gold stripe 6 and so form a damaged region indicated by the shading on FIG. 1. The electrical resistance of this damaged region is very much higher than the resistance in the undamaged regions and the refractive index of the damaged regions is also effectively decreased. Some scattering of the protons that takes place within the lattice structure causes the damaged region to spread into the region beneath the gold stripe 6 as illustrated in FIG. 1. In this example the width ω which is the effective stripe width of the laser is 5 μm. In this example the bombardment proximity t to the active layer 3 was 0.7 μm.

Electrical contacts were then made to the opposite sides of the wafer and the wafer was cleaved to a length of 257 μm. The laser was then indium bonded onto a copper header and tested. FIG. 2 shows the DC light output characteristics plotted against the electrical currate before catastrophic erosion of the facets of the laser occurs.

5. The combination defined by claim 4 in which the stripe of said laser is produced by proton bombardment, the proximity of said bombardment being between 0.7 and 0.2 microns for a stripe width of substantially 5 microns and between 0.3 and 0.0 microns when the stripe width is substantially 10 microns.

6. In an optical communications system including at least a laser and an optical fiber coupled to said laser, the improvement comprising: said laser being of the double heterostructure semiconductor type having an optical cavity which is of non-uniform transverse dimension, said cavity imposing no restriction on the lasing filament of the laser when operating within a predetermined range above threshold, but preventing uniform increase of lasing flux with increase in applied power above said predetermined range, so that said laser flux is self saturating before catastrophic erosion of the facets occurs.

7. In an optical communications system including at least a laser and an optical fiber coupled to said laser, the improvement comprising: said laser being of the double heterostructure semiconductor type having an optical cavity which is of non-uniform transverse dimension, said cavity imposing no restriction on the lasing filament of the laser when operating within a predetermined range above threshold, but preventing uniform increase of lasing flux with increase in applied power above said predetermined range, so that said laser flux is self saturating before catastrophic erosion of the facets occurs, said cavity including a branched gain region leading away from the remainder of the cavity.

8. The combination of claim 7 in which said branched gain region is Y-shaped.

9. The combination of claim 7 in which said branched gain region is X-shaped.

10. The combination defined by claim 7 in which said branched gain region is loop shaped.

11. In an optical communications system including at least a laser and an optical fiber coupled to said laser, the improvement comprising: a coupling lens arranged to couple said laser and optical fiber, said laser having means for providing a substantially constant incremental efficiency in a predetermined operating range above its lasing threshold and a decreasing incremental efficiency when operated above said predetermined range so that the lasing flux has self saturating properties.

* * * * *